(12) United States Patent
Ibaraki

(10) Patent No.: US 11,908,837 B2
(45) Date of Patent: Feb. 20, 2024

(54) SEMICONDUCTOR DEVICE

(71) Applicant: Kioxia Corporation, Tokyo (JP)

(72) Inventor: Soichiro Ibaraki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 122 days.

(21) Appl. No.: 17/409,519

(22) Filed: Aug. 23, 2021

(65) Prior Publication Data

US 2022/0302083 A1 Sep. 22, 2022

(30) Foreign Application Priority Data

Mar. 16, 2021 (JP) ................... 2021-042091

(51) Int. Cl.
*H01L 25/065* (2023.01)
*H01L 23/552* (2006.01)
*H01L 23/14* (2006.01)

(52) U.S. Cl.
CPC ........ *H01L 25/0657* (2013.01); *H01L 23/145* (2013.01); *H01L 23/147* (2013.01); *H01L 23/552* (2013.01); *H01L 25/0652* (2013.01); H01L 2225/0651 (2013.01); H01L 2225/06506 (2013.01); H01L 2225/06517 (2013.01); H01L 2225/06537 (2013.01); H01L 2225/06562 (2013.01); H01L 2225/06575 (2013.01); H01L 2225/06586 (2013.01)

(58) Field of Classification Search
CPC ......... H01L 23/556; H01L 2225/06537; H01L 25/0657
See application file for complete search history.

(56) References Cited

U.S. PATENT DOCUMENTS

| 7,119,428 | B2 | 10/2006 | Tanie et al. |
| 7,582,973 | B2 | 9/2009 | Hamaguchi |
| 8,536,714 | B2 | 9/2013 | Sakaguchi |
| 2006/0043585 | A1 | 3/2006 | Sukegawa et al. |
| 2014/0085829 | A1 | 3/2014 | Yamashita |
| 2016/0172337 | A1 | 6/2016 | Kim |

(Continued)

FOREIGN PATENT DOCUMENTS

| JP | 4205613 | 1/2009 |
| JP | 4899406 | 3/2012 |

(Continued)

*Primary Examiner* — Yu-Hsi D Sun
(74) *Attorney, Agent, or Firm* — Foley & Lardner LLP

(57) ABSTRACT

In a semiconductor device, a first interposer has a first main surface. A second interposer is disposed on the first main surface. The second interposer has a second main surface on a side opposite to the first interposer. A material of the second interposer is different from that of the first interposer. A first semiconductor chip has a first front surface. The first semiconductor chip is mounted on the second main surface through a plurality of bump electrodes with the first front surface facing the second main surface. The first semiconductor chip includes a volatile memory circuit. A second semiconductor chip is mounted on a plurality of electrode patterns disposed on the first main surface or the second main surface through a plurality of bonding wires. The second interposer overlaps the first semiconductor chip in a direction perpendicular to the first main surface.

17 Claims, 14 Drawing Sheets

(56) References Cited

U.S. PATENT DOCUMENTS

| | | |
|---|---|---|
| 2016/0218081 A1 | 7/2016 | Kim |
| 2017/0278806 A1 | 9/2017 | Kuo et al. |
| 2018/0130782 A1 | 5/2018 | Lee |
| 2019/0214369 A1* | 7/2019 | Seidemann ............ H01L 23/00 |
| 2020/0091087 A1 | 3/2020 | Yamashita et al. |
| 2020/0273783 A1* | 8/2020 | Sankman .......... H01L 23/49861 |
| 2020/0303290 A1 | 9/2020 | Fujimori et al. |

FOREIGN PATENT DOCUMENTS

| | | |
|---|---|---|
| JP | 5808586 | 1/2015 |
| JP | 5752741 | 7/2015 |
| JP | 2020-047714 | 3/2020 |
| JP | 2020-155596 | 9/2020 |
| TW | 201628139 A | 8/2016 |
| TW | 201735282 A | 10/2017 |

* cited by examiner

SEMICONDUCTOR DEVICE

CROSS-REFERENCE TO RELATED APPLICATION

This application is based upon and claims the benefit of priority from Japanese Patent Application No. 2021-042091, filed Mar. 16, 2021, the entire contents of which are incorporated herein by reference.

FIELD

Embodiments described herein relate generally to a semiconductor device.

BACKGROUND

A semiconductor device may be configured by mounting a semiconductor chip on a main surface of an interposer through a plurality of bump electrodes. In this case, it is desired to improve reliability of the mounted semiconductor chip.

DETAILED DESCRIPTION

Figure 1:
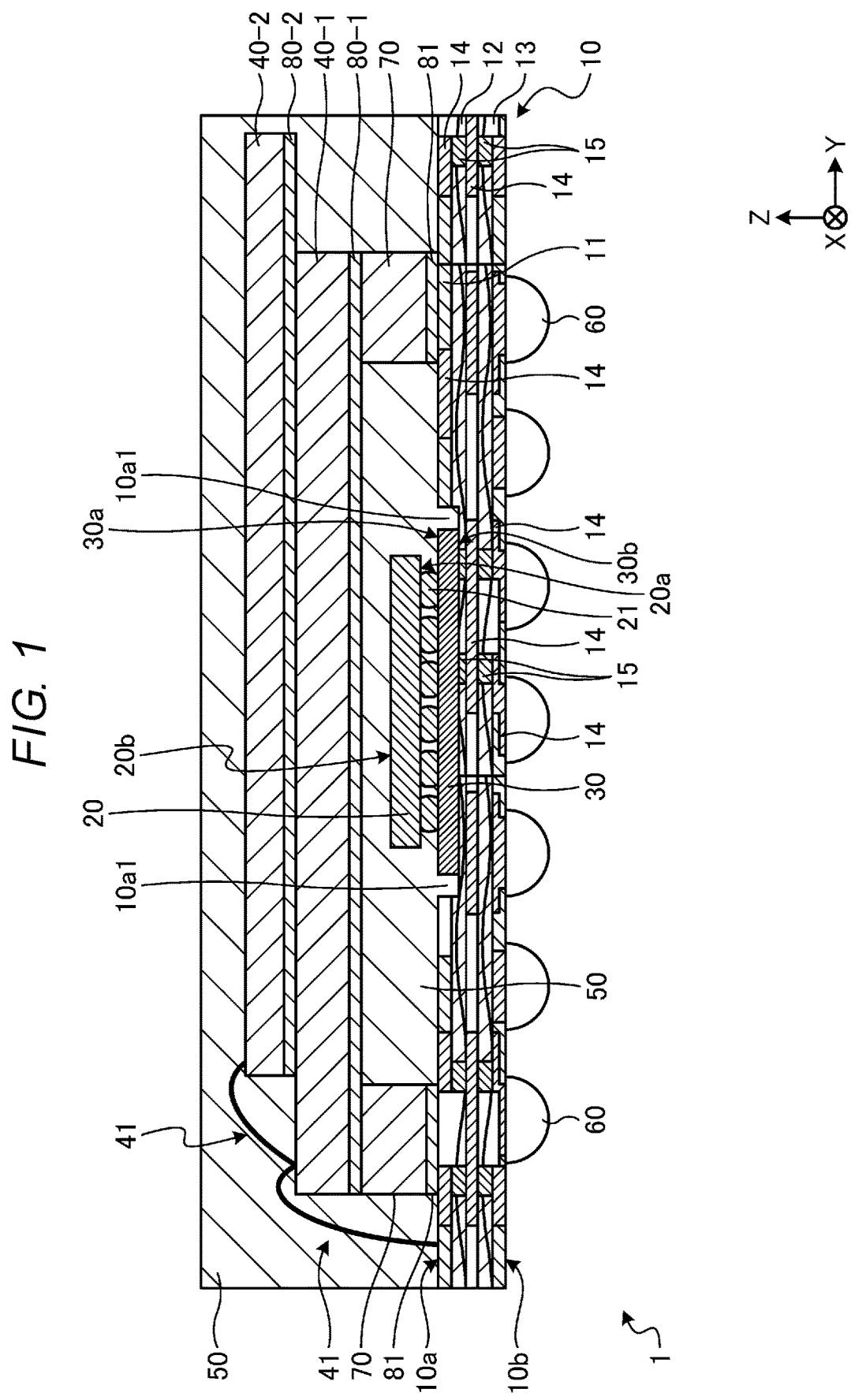
FIG. 1 is a cross-sectional view illustrating a configuration of a semiconductor device according to at least one embodiment.

At least one embodiment provides a semiconductor device capable of improving reliability of a semiconductor chip mounted thereon.

In general, according to at least one embodiment, there is provided a semiconductor device including a first interposer, a second interposer, a first semiconductor chip, and a second semiconductor chip. The first interposer has a first main surface. The second interposer is disposed on the first main surface. The second interposer has a second main surface on a side opposite to the first interposer. A material of the second interposer is different from that of the first interposer. The first semiconductor chip has a first front surface. The first semiconductor chip is mounted on the second main surface through a plurality of bump electrodes with the first front surface facing the second main surface. The first semiconductor chip includes a volatile memory circuit. The second semiconductor chip is mounted on a plurality of electrode patterns disposed on the first main surface or the second main surface through a plurality of bonding wires. The second interposer overlaps the first semiconductor chip in a direction perpendicular to the first main surface.

Hereinafter, the semiconductor device according to at least one embodiment will be described in detail with reference to the accompanying drawings. The present disclosure is not limited to these embodiments, however.

Embodiment

The semiconductor device according to at least one embodiment is a hybrid type semiconductor device on which a plurality of types of semiconductor chips are mixedly mounted. For example, with the progress of high performance, high functionality, lightness, thinness, and miniaturization of a mobile device representing a smartphone, it may be required to achieve both large capacity of a memory semiconductor device mounted on the device and lightness, thinness, and miniaturization of a package. In response to such a requirement, on the semiconductor device, a first semiconductor chip and a second semiconductor chip of different types may be mounted in a mixed fashion. The first semiconductor chip is, for example, a memory controller, and the second semiconductor chip is, for example, a memory chip such as a flash memory. The second semiconductor chip is configured to have a larger chip size than that of the first semiconductor chip in order to ensure a memory capacity. An area in which the first semiconductor chip is disposed may be limited depending on the disposition of the second semiconductor chip.

For example, in universal flash storage (UFS), which is a typical embedded memory which is a form of a hybrid memory module, the longitudinal and lateral dimensions of the enclosure are regulated by an external standard organization, and a degree of freedom in package design is small. For a large-capacity product, it is conceivable to adopt a structure in which the second semiconductor chips are stacked stepwise in order to improve mounting density. In the case of a package of chip scale package (CSP) type in which the long side dimensions of the chip and the package are substantially the same, in order to implement high-speed signal transmission and reception with the host side, the first semiconductor chip may be disposed directly below the lowest stage of the plurality of second semiconductor chips stacked stepwise. Furthermore, in order to reduce a load due to a parasitic LCR component of a bonding wire of a host interface of the first semiconductor chip and shorten an electrical path length, and to cope with the increase in the number of pins accompanying the high functionality of the first semiconductor chip, it is conceivable to mount the first semiconductor chip in a flip-chip structure.

When the first semiconductor chip is a memory controller, a volatile memory circuit may be mounted thereon as a cache region or the like. The volatile memory circuit is, for example, a static random access memory (SRAM). In the first semiconductor chip, the SRAM tends to have a large capacity and a low voltage due to the increase in the system scale, and these factors have a trade-off relationship with a soft error rate (FIT) per unit device.

For example, a configuration in which the first semiconductor chip is mounted on a first interposer is considered. As the first interposer, an organic interposer including a radiation source may be used from the viewpoint of cost and the like. When the first semiconductor chip is mounted on the first interposer in the flip-chip structure, the distance to the radiation source in the first interposer may be closer than when the first semiconductor chip is mounted on the first interposer in a bonding wire structure. With this configuration, the soft error is likely to occur in the SRAM mounted on the first semiconductor chip, and soft error immunity such as bit flip immunity may decrease.

When the flip-chip structure is adopted for the first semiconductor chip, a low-profile bump and a narrow-pitch flip-chip connection can be implemented by increasing the number of pins of the first semiconductor chip. For that reason, a mismatch of a coefficient of linear expansion between the first interposer (for example, an organic interposer) and the first semiconductor chip may cause a joint portion of an electrode to break. As a result, a decrease in connection reliability, that is mechanical reliability, may be caused.

The circuit density tends to increase due to the high performance and high functionality of the first semiconductor chip. But when the chip area tends to shrink, heat generation density in the first semiconductor chip tends to increase. For that reason, the reliability of quality and performance of the semiconductor device, that is, the thermal reliability may decrease due to the further temperature rise of the first semiconductor chip.

Therefore, in at least one embodiment, in the semiconductor device, a second interposer is added between the first interposer and the first semiconductor chip, and the first semiconductor chip is flip-chip mounted on the second interposer. The second interposer may be made of a material that has a higher radiation shielding ability than that of the first interposer and has mechanical and thermal characteristics closer to those of the first semiconductor chip. With this configuration, in the semiconductor device, improvement of soft error immunity and improvement of mechanical and thermal reliability are achieved.

Figure 2:
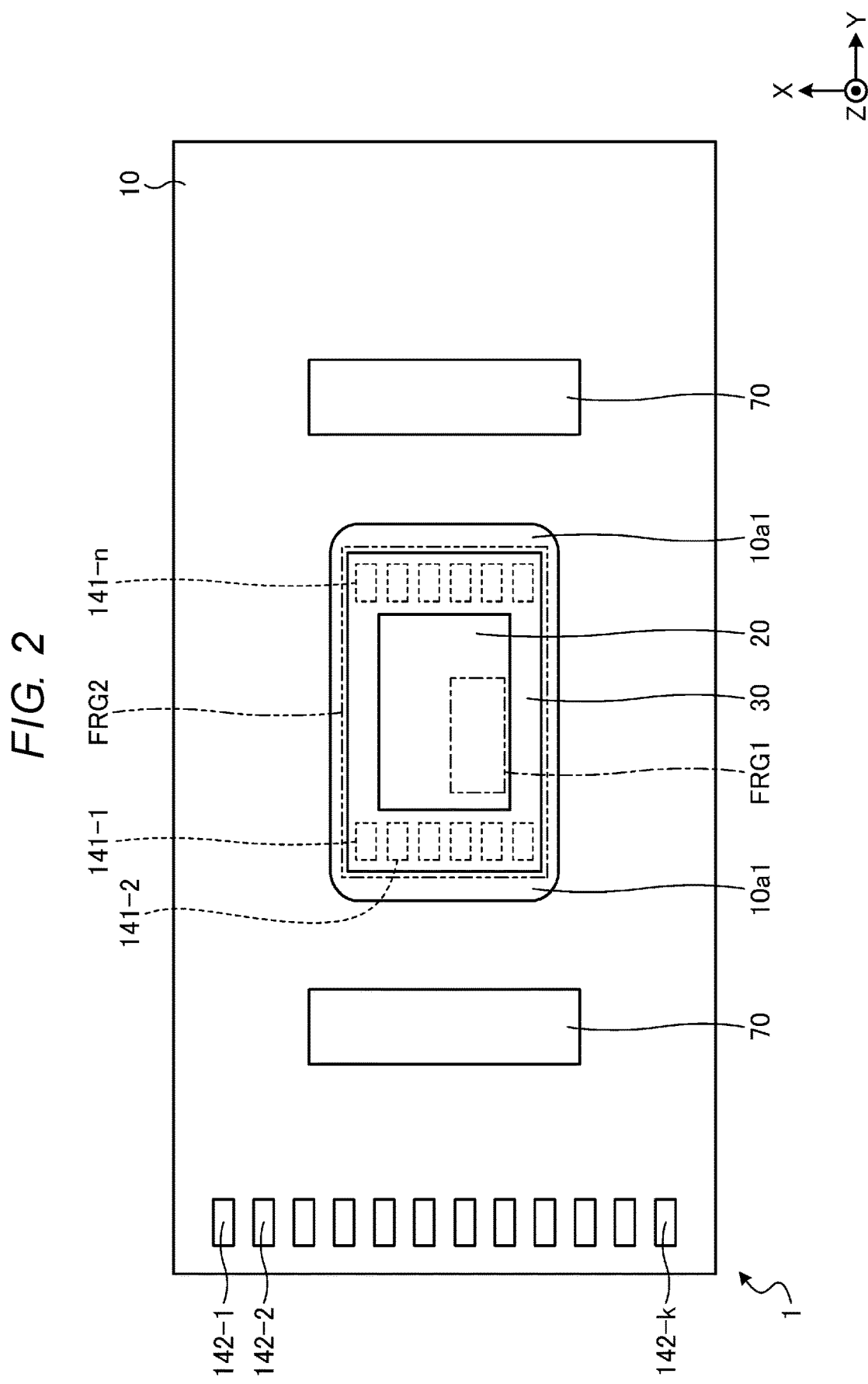
FIG. 2 is a plan view illustrating the configuration of the semiconductor device according to at least one embodiment.

Specifically, a semiconductor device 1 may be configured as illustrated in FIGS. 1 and 2. FIG. 1 is a cross-sectional view illustrating a configuration of the semiconductor device 1. FIG. 2 is a plan view illustrating the configuration of the semiconductor device 1.

The semiconductor device 1 includes an interposer (first interposer) 10, a semiconductor chip (first semiconductor chip) 20, an interposer (second interposer) 30, a plurality of semiconductor chips (plurality of second semiconductor chips) 40-1 and 40-2, a sealing resin 50, external electrodes 60, and a spacer 70. In the following, the direction perpendicular to one (front surface 10a, first main surface) of the surfaces having the largest area of the interposer 10 is defined as the Z-direction, and the two directions orthogonal to each other in a plane perpendicular to the Z-direction are defined as the X-direction and the Y-direction.

The interposer 10 has a surface (front surface 10a, first main surface) having the largest area on the +Z-side and another surface (rear surface 10b, second main surface) having the largest area on the −Z-side. The interposer 30 is disposed on the front surface 10a of the interposer 10, and the semiconductor chip 20 is mounted on the front surface 10a through the interposer 30. The plurality of semiconductor chips 40-1 and 40-2 are mounted on the front surface 10a side of the interposer 10 through an adhesive layer 81 and the spacer 70.

An opening 10a1 is provided on the front surface 10a of the interposer 10. The interposer 30 is disposed within the opening 10a1. For example, a rear surface 30b of the interposer 30 may adhere to the bottom surface of the opening 10a1 with an adhesive or the like. The interposer 30 is substantially rectangular in XY-plan view and substantially rectangular in YZ-plan view.

The opening 10a1 has a planar shape corresponding to the interposer 30. For example, the opening 10a1 can be formed by counterboring the front surface 10a of the interposer 10 using a laser or a drill. For that reason, the opening 10a1 may have a shape that is recognized as having an approximately rectangular shape with some roundness or chamfering at the corners due to process factors, as illustrated in FIG. 2, in the XY-plan view. In FIG. 2, a planar configuration in which the plurality of semiconductor chips 40-1 and 40-2 and the sealing resin 50 are removed is illustrated. A width of the opening 10a1 in the X-direction corresponds to a width of the interposer 30 in the X-direction, and has a size obtained by adding a margin to the width of the interposer 30 in the X-direction. The width of the opening 10a1 in the Y-direction corresponds to the width of the interposer 30 in the Y-direction, and has a size obtained by adding a margin to the width of the interposer 30 in the Y-direction. When seen through from the Z-direction, the opening 10a1 includes the interposer 30 therein.

The opening 10a1 has a cross-sectional shape corresponding to the interposer 30. The opening 10a1 is substantially rectangular as illustrated in FIG. 1 in YZ-plan view. A depth of the opening 10a1 in the Z-direction corresponds to a thickness of the interposer 30 in the Z-direction. The depth of the opening 10a1 in the Z-direction may be substantially equal to the thickness of the interposer 30 in the Z-direction. In this case, the front surface of the interposer 30 disposed within the opening 10a1 and the front surface 10a of the interposer 10 may be substantially flush with each other. With this configuration, a mounting height of the interposer 30 in the Z-direction is easily kept low, which can contribute to keeping the mounting height of the entire semiconductor device 1 low.

The depth of the opening 10a1 in the Z-direction may be slightly smaller than the thickness of the interposer 30 in the Z-direction. Even in this case, the mounting height of the interposer 30 in the Z-direction is easily kept low according to the depth of the opening 10a1 in the Z-direction, which can contribute to keeping the mounting height of the entire semiconductor device 1 low.

The external electrodes 60 are mounted on the rear surface 10b of the interposer 10. The semiconductor chip 20, the interposer 30, and the plurality of semiconductor chips 40 mounted on the front surface 10a side of the interposer 10 are sealed with the sealing resin 50. Each of the external electrodes 60 mounted on the rear surface 10b side of the interposer 10 maybe formed of a material containing a conductive material as a main component, the front surface thereof is exposed, and can be electrically connected from the outside.

The interposer 10 may be an organic interposer containing an organic substance such as a printed wiring board. In the interposer 10, a portion occupying a large proportion in volume may be formed of an organic substance. The interposer 10 may include a solder resist layer 11, a prepreg layer 12, a core layer 13, a conductive layer 14, and a through-hole electrode 15. The solder resist layer 11 may be formed of a material containing an insulating material (for example, an insulating organic substance) as a main component. The material of the solder resist layer 11 may contain a trace amount of radioactive substance. The prepreg layer 12 may be formed of a material containing an insulating material (for example, an organic substance such as plastic) as a main component. The material of the prepreg layer 12 may contain a trace amount of radioactive substance. The core layer 13 may be formed of a material containing an insulating material (for example, an organic substance such as plastic) as a main component. The material of the core layer 13 may contain a trace amount of radioactive substance. The conductive layer 14 may be formed of a material containing a conductive material (for example, copper) as a main component. The through-hole electrode 15 may be formed of a material containing a conductive material (for example, copper) as a main component.

The semiconductor chip 20 is, for example, a controller chip. The semiconductor chip 20 has a surface having the largest area (front surface 20a, third main surface) on the −Z-side, and another surface (rear surface 20b, fourth main surface) having the largest area on the +Z-side. When the semiconductor device 1 is an SSD, the semiconductor chip 20 is, for example, a controller chip, and can be mounted on the interposer 10 by a flip-chip method. The front surface 20a of the semiconductor chip 20 faces a front surface 30a of the interposer 30. The semiconductor chip 20 is mounted on the front surface 30a of the interposer 30 through a plurality of bump electrodes 21 by a face-down method (flip-chip method). That is, the semiconductor chip 20 is mounted on the front surface 30a of the interposer 30 through the plurality of bump electrodes 21 with the front surface 20a facing the front surface 30a of the interposer 30.

A plurality of pad electrodes are disposed on the front surface 20a of the semiconductor chip 20, and the plurality of pad electrodes are electrically connected to a wiring in the interposer 30 through the plurality of bump electrodes 21. The wiring in the interposer 30 is electrically connected to the conductive layer 14 and the through-hole electrode 15 in the interposer 10. With this configuration, a predetermined signal can be transmitted and received to and from the external electrode 60 to the semiconductor chip 20 through the conductive layer 14, the through-hole electrode 15, and the wiring in the interposer 30.

The conductive layer 14 to which the wiring in the interposer 30 can be electrically connected includes a plurality of electrode patterns 141-1 to 141-n (n is any integer of 2 or more) as illustrated by a dotted line in FIG. 2 on the bottom surface of the opening 10a1 of the interposer 10. The plurality of electrode patterns 141-1 to 141-n are arrayed two-dimensionally in the XY-direction. FIG. 2 is a plan view illustrating the configuration of the interposer 10. Since the respective electrode patterns 141-1 to 141-n can transmit signals different from each other, the electrode patterns 141-1 to 141-n can be electrically separated from each other on the bottom surface of the opening 10a1. An arrangement pitch of the electrode patterns 141-1 to 141-n may be larger than the arrangement pitch of the bump electrodes 21.

Figure 3:
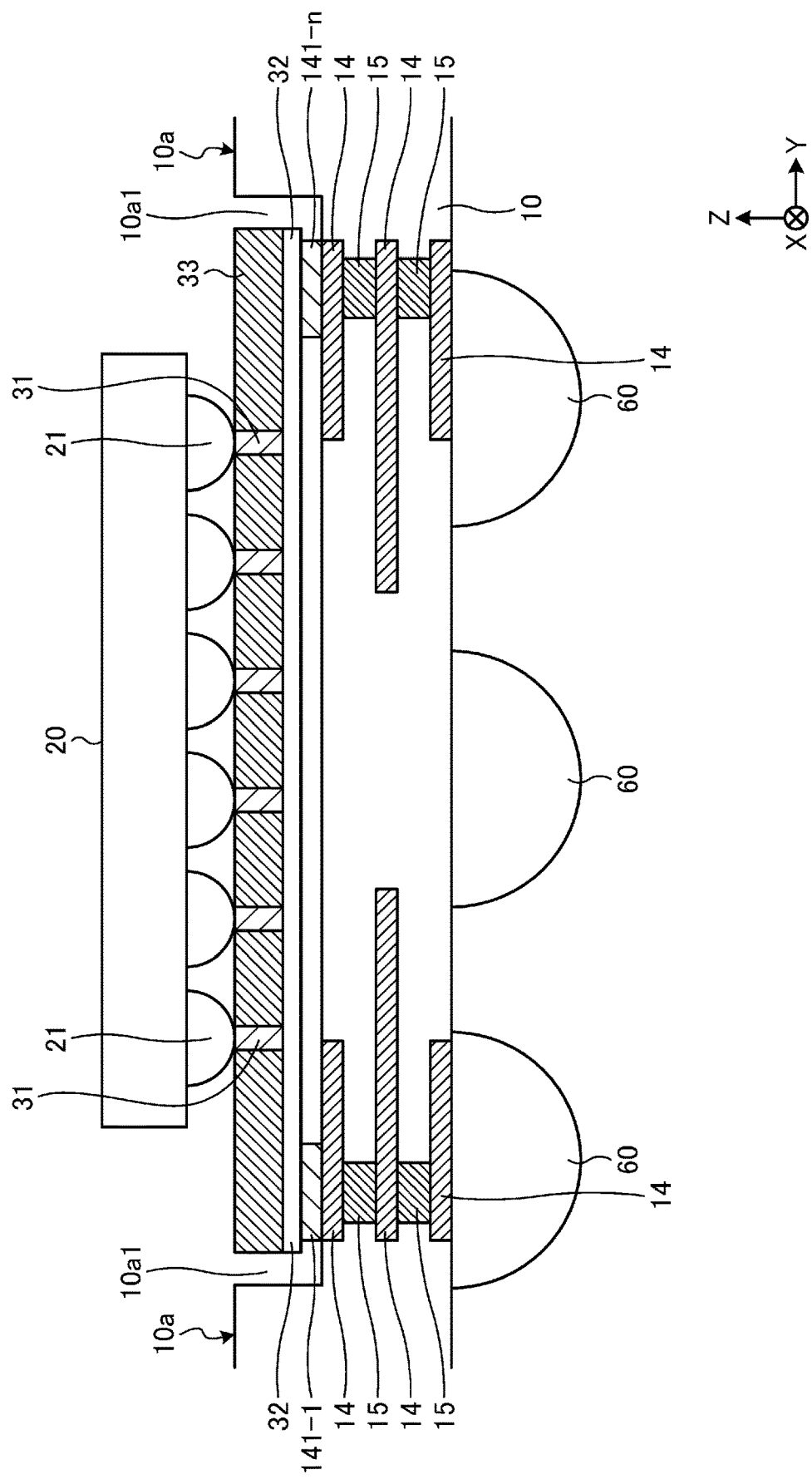
FIG. 3 is a cross-sectional view illustrating a configuration of an interposer according to at least one embodiment.

In the interposer 30, as illustrated in FIG. 3, for example, the wiring for connecting the bump electrode 21 to the electrode pattern 141 is provided. FIG. 3 is a cross-sectional view illustrating the configuration of the interposer 30. The interposer 30 includes a substrate 33, penetration electrodes 31, and a rewiring layer 32. The substrate 33 extends in a flat plate shape along the XY-direction. Each of the penetration electrodes 31 extends in the Z-direction and penetrates the substrate 33 from the +Z-side to the −Z-side. The penetration electrode 31 may be formed of a conductive material (for example, metal such as copper). The rewiring layer 32 is disposed on the surface of the substrate 33 on the −Z-side. The +Z-side surface of the penetration electrode 31 comes into contact with the bump electrode 21 to be electrically connected, and the +Z-side surface thereof is electrically connected to the electrode pattern 141 through the rewiring layer 32. A wiring portion of the rewiring layer 32 may be formed of a conductive material (for example, metal such as copper), and the rest of the rewiring layer 32 may be formed of an insulating material (for example, silicon oxide). The electrode pattern 141 is electrically connected to the external electrode 60 through the conductive layer 14 and the through-hole electrode 15.

The wiring for connecting the bump electrode 21 to the conductive layer 14 in the interposer 30 may have a wire bonding structure instead of the penetration electrode 31 and the rewiring layer 32. An electrode to which the bump electrode 21 is connected may be provided on the front surface 30a of the interposer 30, and a wire may be bonded from the electrode to the conductive layer 14.

A CPU and a volatile memory circuit are mounted on the front surface 20a side of the semiconductor chip 20 illustrated in FIG. 1. The volatile memory circuit is, for example, an SRAM circuit. The SRAM circuit temporarily stores data as a work area by the CPU. The front surface 30a of the interposer 30 has a region FRG1 as illustrated in FIG. 2. When seen through from the direction (Z-direction) perpendicular to the front surface 30a of the interposer 30, the region FRG1 overlaps the SRAM circuit when the semiconductor chip 20 is mounted on the interposer 30 by the flip-chip method. The region FRG1 is approximately equal in area to the SRAM circuit (for example, mathematically congruent with the SRAM circuit). The region FRG1 is located inside a region FRG2. When seen through from the Z-direction, the region FRG2 overlaps the semiconductor chip 20 when the semiconductor chip 20 is mounted on the interposer 30 by the flip-chip method. The region FRG2 is approximately equal in area to the semiconductor chip 20 (for example, mathematically congruent with the semiconductor chip 20). That is, the region FRG2 is a region that overlaps the semiconductor chip 20 when seen through from the Z-direction, and is a region that includes the SRAM circuit therein when seen through from the Z-direction. An XY-area of the interposer 30 corresponds to the XY-area of the semiconductor chip 20, and may be an area obtained by adding an area of arrangement margin to the XY-area of the semiconductor chip 20.

The material of the interposer 30 is different from that of the interposer 10. The interposer 30 may be formed of a material having a higher radiation shielding ability than that of the interposer 10. The interposer 30 may be formed of a material having mechanical and thermal characteristics closer to those of the semiconductor chip 20 than the interposer 10. A difference between a coefficient of linear expansion of the interposer 30 and a coefficient of linear expansion of the semiconductor chip 20 is smaller than a difference between a coefficient of linear expansion of the interposer 10 and the coefficient of linear expansion of the semiconductor chip 20. The interposer 30 may be formed of a material having a higher thermal conductivity than that of the interposer 10.

For example, the interposer 30 may be a semiconductor interposer including a semiconductor. In the interposer 30, a portion occupying a large part in volume may be formed of a semiconductor. The interposer 30 is disposed within the opening 10a1 of the front surface 10a of the interposer 10. For example, the interposer 30 covers the region FRG2 on the front surface 20a of the semiconductor chip 20 (see FIG. 1). The interposer overlaps the SRAM circuit when seen through from the Z-direction. The interposer 30 includes the SRAM circuit therein when seen through from the Z-direction. When seen through from the Z-direction, the interposer 30 overlaps the semiconductor chip 20 in the region FRG2. In the interposer 30, the substrate 33 (see FIG. 3) may be formed of a material containing a semiconductor (for example, silicon) as a main component. When the interposer 10 is an organic interposer and the interposer 30 is a semiconductor interposer, the interposer 30 has a higher radiation shielding ability than that of the interposer 10.

Figure 4:
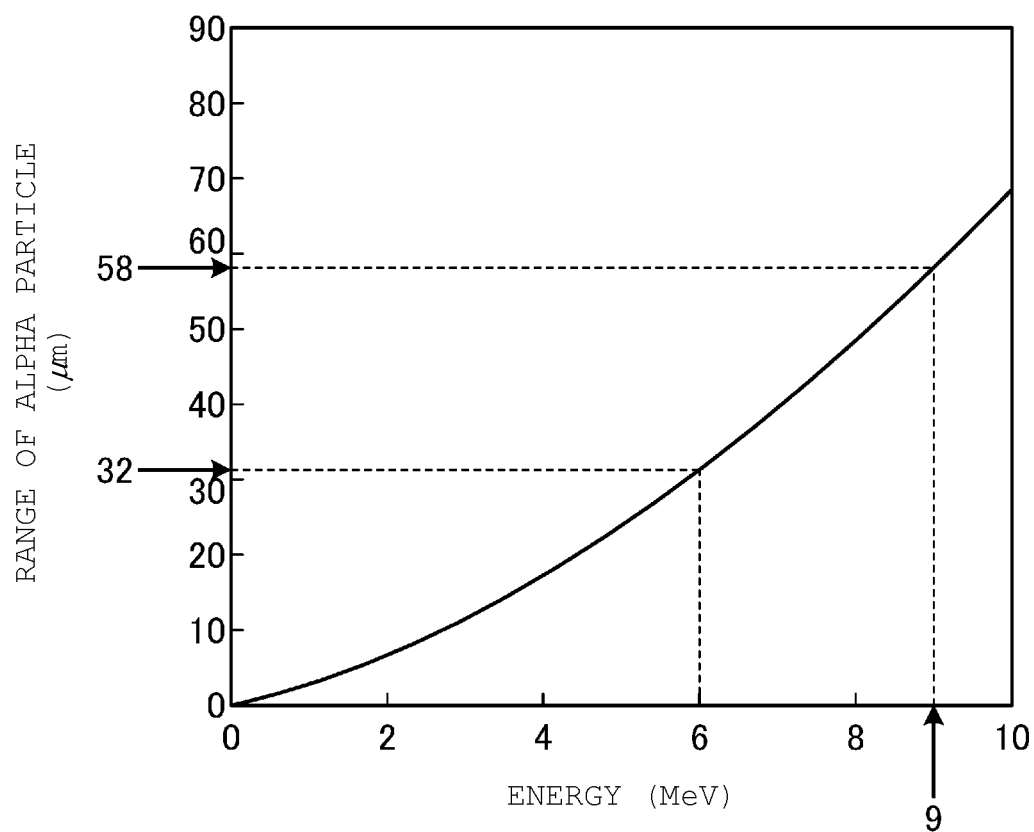
FIG. 4 is a graph illustrating a correlation between energy of an alpha particle and a range of the alpha particle in silicon.

For example, a correlation between energy of an alpha particle and a range (flying distance) of the alpha particle in silicon is illustrated in FIG. 4. FIG. 4 is a diagram illustrating the correlation between the energy of the alpha particle and the range of the alpha particle in silicon.

When the energy of radiation (for example, α-ray) coming from the radioactive substance contained in the interposer 10 is 9 MeV or less, the range of the alpha particle in silicon is approximately 58 μm. When the interposer 30 is formed of a material containing silicon as a main component, the thickness of the interposer 30 in the Z-direction may be 58 μm or more. With this configuration, the radiation (for example, α-ray) coming from the radioactive substance contained in the interposer 10 can be effectively shielded by the interposer 30. The thickness of the interposer 30 in the Z-direction may be smaller than the thickness of the interposer 10 in the Z-direction. With this configuration, the interposer 30 can be substantially accommodated in the opening 10a1 of the front surface 10a of the interposer 10, and the mounting height of the interposer 30 can be effectively reduced.

When the energy of radiation (for example, α-ray) coming from the radioactive substance contained in the interposer 10 is 6 MeV or less, the range of the alpha particle in silicon is approximately 32 μm. When the interposer 30 is formed of a material containing silicon as a main component, the thickness of the interposer 30 in the Z-direction may be 32 μm or more. With this configuration, the radiation (for example, α-ray) coming from the radioactive substance contained in the interposer 10 can be effectively shielded by the interposer 30. The thickness of the interposer 30 in the Z-direction may be smaller than the thickness of the interposer 10 in the Z-direction. With this configuration, the interposer 30 can be substantially accommodated in the opening 10a1 of the front surface 10a of the interposer 10, and the mounting height of the interposer 30 can be effectively reduced.

In the interposer 30, the substrate 33 illustrated in FIG. 3 can be placed in a potentially floating state. As a result, signals can be reliably transmitted and received between the bump electrodes 21 and the external electrodes 60 by the wiring in the interposer 30.

The difference between the coefficient of linear expansion of the interposer 30 and the coefficient of linear expansion of the semiconductor chip 20 illustrated in FIG. 1 is smaller than the difference between the coefficient of linear expansion of the interposer 10 and the coefficient of linear expansion of the semiconductor chip 20. For example, when the interposer 10 is an organic interposer and the interposer 30 is a semiconductor interposer, the interposer 30 has mechanical and thermal characteristics closer to those of the semiconductor chip 20 than the interposer 10. The coefficient of linear expansion of the interposer 30 is closer to the coefficient of linear expansion of the semiconductor chip 20 than the coefficient of linear expansion of the interposer 10. With this configuration, when the semiconductor device 1 is placed in a high temperature environment or the like, stress acting between the interposer 30 and the semiconductor chip 20 through the bump electrode 21 can be reduced as compared to when the semiconductor chip 20 is mounted on the interposer 10. With this configuration, the reliability in mechanical connection between the interposer 30 and the semiconductor chip 20 can be improved.

The thermal conductivity of the interposer 30 is higher than the thermal conductivity of the interposer 10. For example, when the interposer 10 is an organic interposer and the interposer 30 is a semiconductor interposer, the thermal conductivity of the interposer 30 is higher than the thermal conductivity of the interposer 10. With this configuration, when the circuit density increases due to the high performance and high functionality of the semiconductor chip 20, the chip area tends to shrink, and the heat generation density increases, the interposer 30 can function as a heat slug that releases heat of the semiconductor chip 20 in the XY-plane direction and dissipates heat to the surrounding atmosphere. With this configuration, the temperature rise of the semiconductor chip 20 can be prevented, and the quality and reliability of the semiconductor device 1 can be improved.

The plurality of semiconductor chips 40 are, for example, memory chips, respectively, and are mounted on the semiconductor chip (controller chip) 20 in a spacer structure. That is, the spacer 70 thicker than the mounting height of the semiconductor chip 20 from the front surface 10a of the interposer 10 is disposed at a position separated from the semiconductor chip 20 in the XY-direction. The plurality of semiconductor chips 40 are stacked on the +Z-side of the spacer 70. The surface of the spacer 70 on the −Z-side adheres to the front surface 10a of the interposer 10 through the adhesive layer 81. The surface of the semiconductor chip 40-1 on the −Z-side adheres to the surface of the spacer 70 on the +Z-side through an adhesive layer 80-1. The surface of the semiconductor chip 40-2 on the −Z-side adheres to the surface of the semiconductor chip 40-1 on the +Z-side through an adhesive layer 80-2. The adhesive layers 81, 80-1, and 80-2 may be, for example, a die attach film (DAF), respectively.

The plurality of semiconductor chips 40 may be mounted on the interposer 10 by a wire bonding method. In this case, the conductive layer 14 to which a plurality of bonding wires 41 in the interposer 10 can be electrically connected includes a plurality of electrode patterns 142-1 to 142-2k (k is any integer of 2 or more) as illustrated in FIG. 2 on the front surface 10a (main surface on the +Z-side). The plurality of semiconductor chips 40 are mounted on the plurality of electrode patterns 142-1 to 142-2k through the plurality of bonding wires 41. With this configuration, the plurality of semiconductor chips 40 can be mounted on the interposer 10 in a spacer structure by the wire bonding method.

As described above, in at least one embodiment, in the semiconductor device 1, the interposer 30 is added between the interposer 10 and the semiconductor chip 20, and the semiconductor chip 20 is flip-chip mounted on the interposer 30. The interposer 30 may be made of a material that has a higher radiation shielding ability than that of the interposer 10 and has mechanical and thermal characteristics closer to those of the semiconductor chip 20. With this configuration, the radiation (for example, α-ray) coming from the radioactive substance contained in the interposer 10 can be effectively shielded by the interposer 30, and thus the soft error immunity can be improved in the semiconductor device 1. When the semiconductor device 1 is placed in a high temperature environment or the like, stress acting between the interposer 30 and the semiconductor chip 20 through the bump electrode 21 can be reduced. Thus, the reliability in mechanical connection between the interposer 30 and the semiconductor chip 20 can be improved. The interposer 30 can function as a heat slug that releases heat of the semiconductor chip 20 in the XY-plane direction and dissipates heat in the surrounding atmosphere. Thus, the temperature rise of the semiconductor chip 20 can be prevented, the quality of the semiconductor device 1 can be improved, and the thermal reliability can also be improved.

Figure 5:
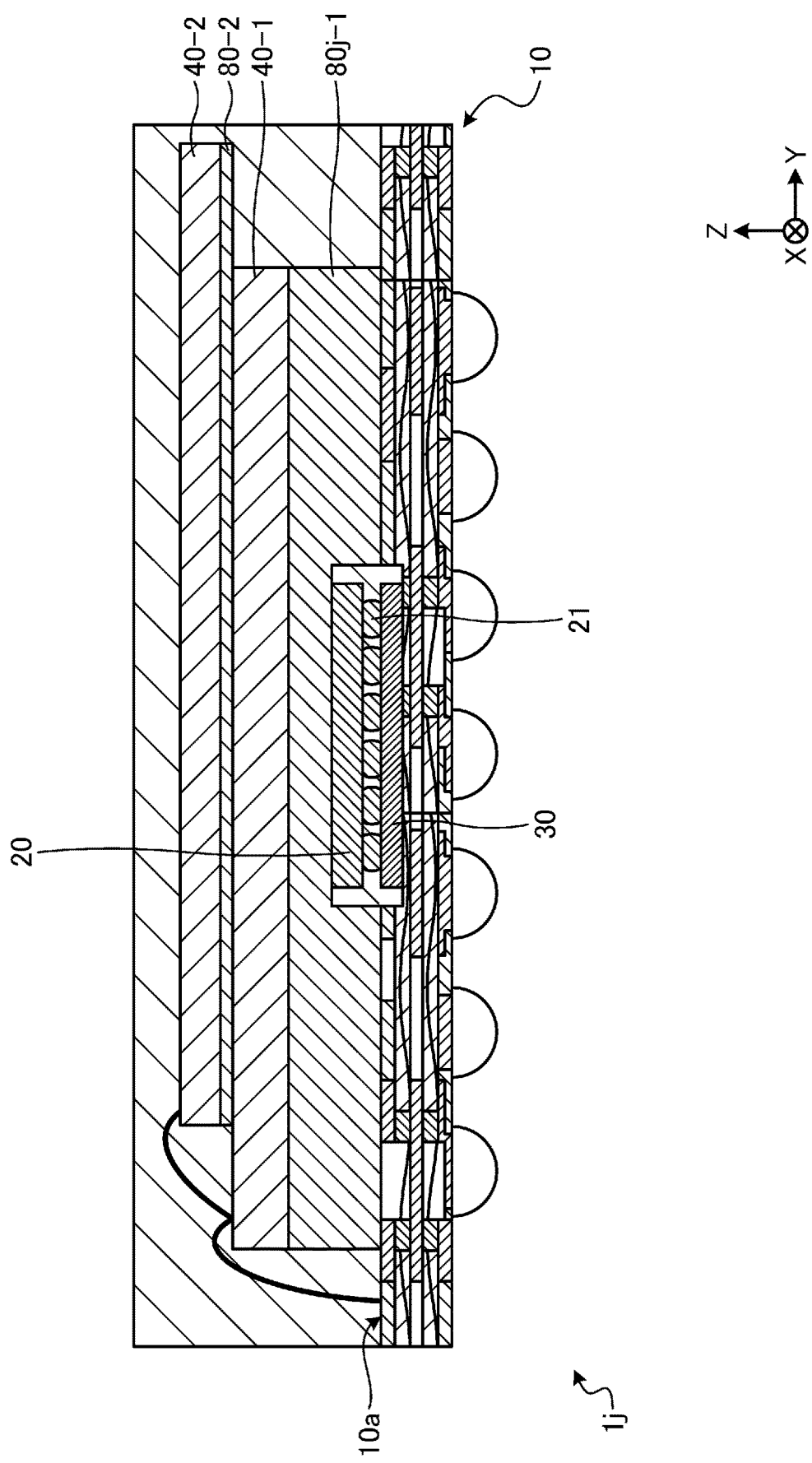
FIG. 5 is a cross-sectional view illustrating a configuration of a semiconductor device according to a first modification of at least one embodiment.

As a first modification of the at least one embodiment, as illustrated in FIG. 5, a semiconductor device 1j may have a structure in which the spacer 70 is omitted and an adhesive layer 80j-1 thicker than the mounting height of the semiconductor chip 20 from the front surface 10a of the interposer 10 is provided instead. FIG. 5 is a cross-sectional view illustrating a configuration of the semiconductor device 1j. The adhesive layer 80j-1 adheres the semiconductor chip 40-1 to the front surface 10a of the interposer 10 and covers the semiconductor chip (controller chip) 20 to secure the mounting height of the bump electrode 21 and the semiconductor chip 20. With this configuration, a structure corresponding to the spacer structure can be implemented without using the spacer 70, and thus the mounting cost can be reduced.

Figure 6:
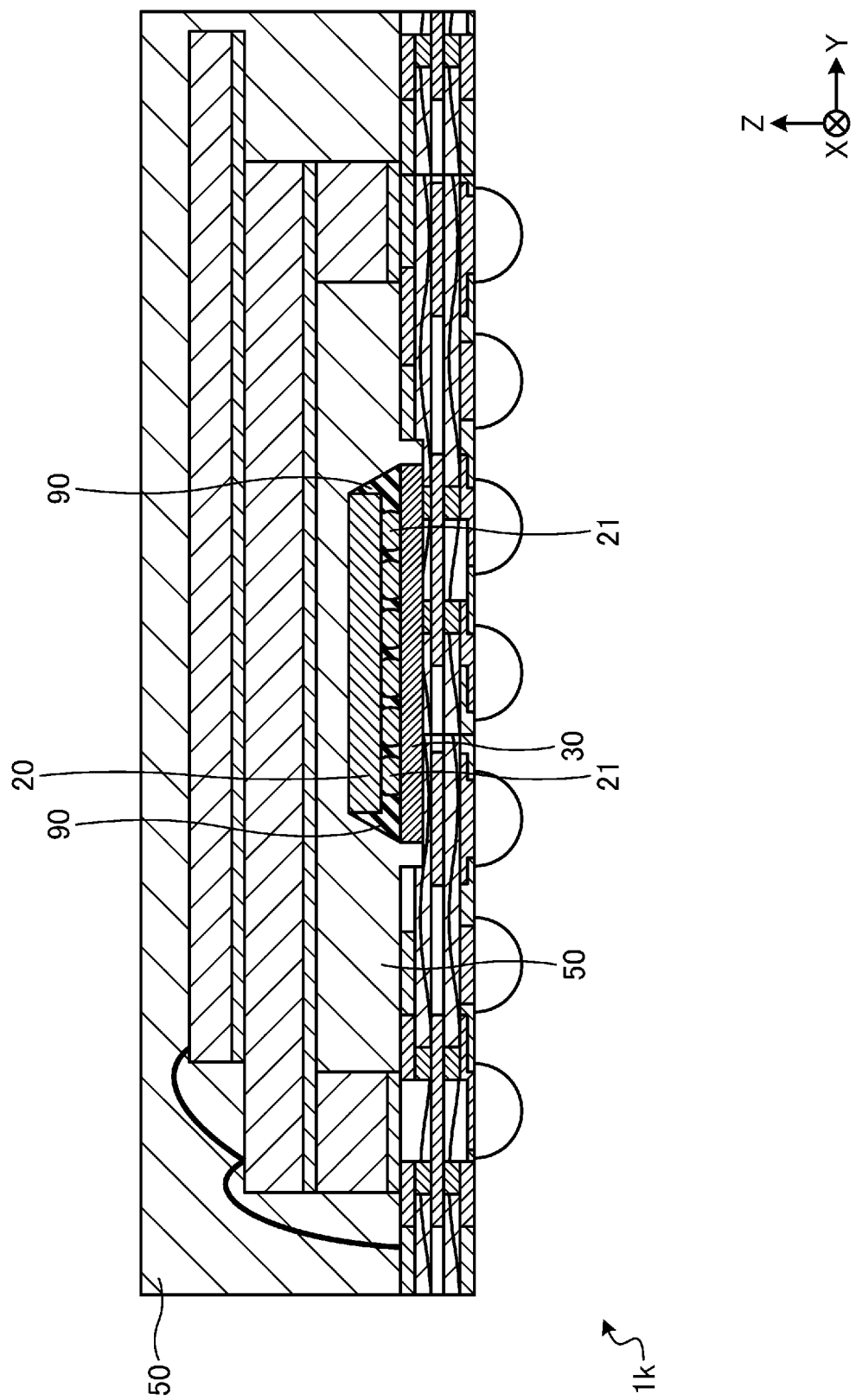
FIG. 6 is a cross-sectional view illustrating a configuration of a semiconductor device according to a second modification of at least one embodiment.

As a second modification of the embodiment, as illustrated in FIG. 6, in a semiconductor device 1k, an underfill resin 90 may be filled in gaps between the plurality of bump electrodes 21 between the semiconductor chip 20 and the interposer 30. FIG. 6 is a cross-sectional view illustrating a configuration of the semiconductor device 1k. As the underfill resin 90, an epoxy resin mixed with silica may be used as a filler. In this case, an average particle diameter of the filler can be set within the range of 0.5 to 3 µm. The filler content can be set to be in the range of 60 to 75 wt %. With this configuration, the plurality of bump electrodes 21 can be reliably insulated from each other without filling the sealing resin 50 between the semiconductor chip 20 and the interposer 30, and reliability of the semiconductor device 1k as a package can be improved.

Figure 7:
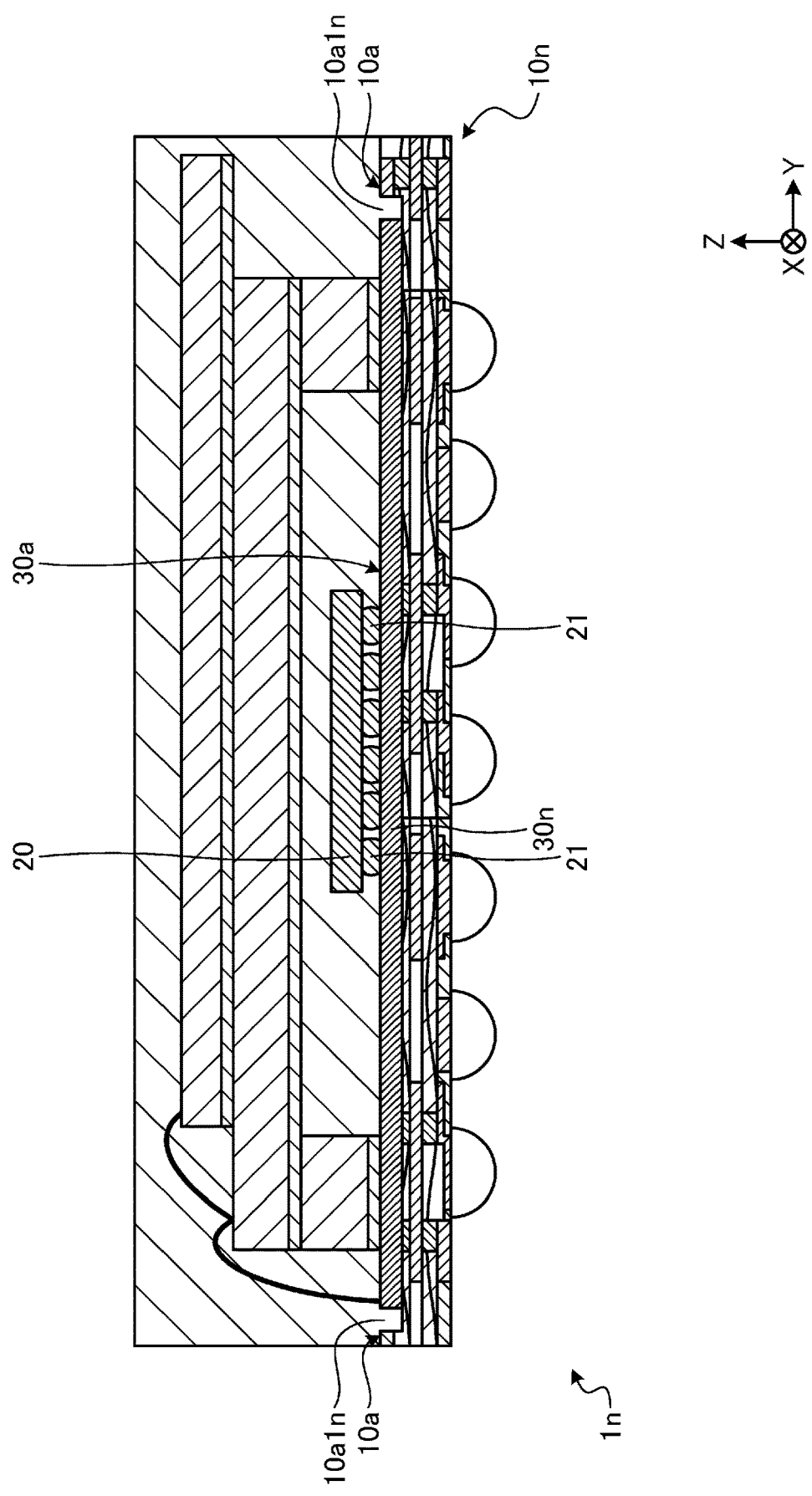
FIG. 7 is a cross-sectional view illustrating a configuration of a semiconductor device according to a third modification of at least one embodiment.
Figure 8:
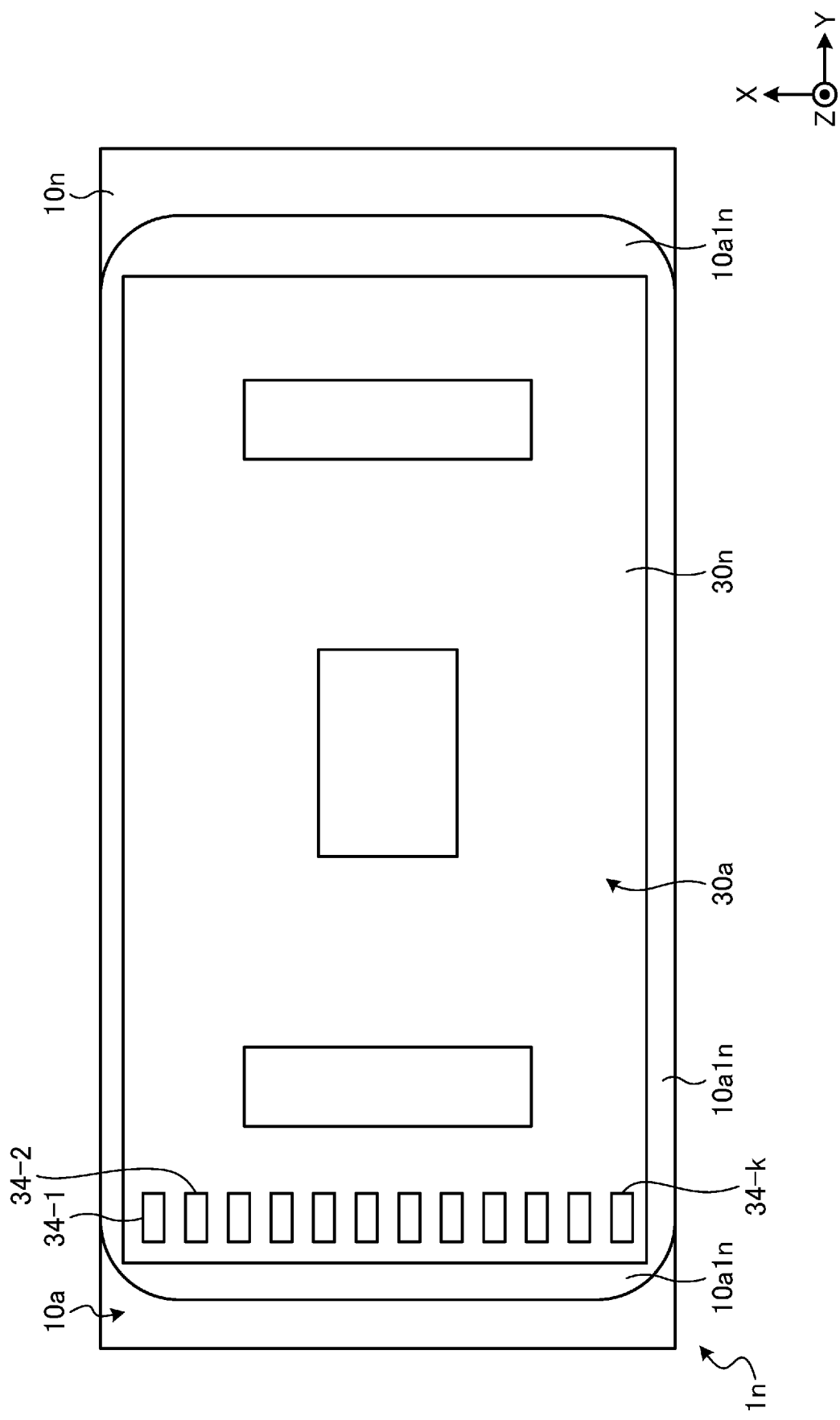
FIG. 8 is a plan view illustrating the configuration of the semiconductor device according to the third modification of at least one embodiment.

As a third modification of the at least one embodiment, as illustrated in FIGS. 7 and 8, in a semiconductor device 1n, an area of an interposer 30n may correspond to an area of an interposer 10n. FIG. 7 is a cross-sectional view illustrating a configuration of the semiconductor device 1n. FIG. 8 is a plan view illustrating the configuration of the semiconductor device 1n. On the front surface 10a of the interposer 10n, an opening 10a1n is provided over almost the entire surface. The third modification is similar to the embodiment in that the opening 10a1n has a planar shape and a cross-sectional shape that correspond to the interposer 30n. In this case, the interposer 30n includes a plurality of electrode patterns 34-1 to 34-2k (k is any integer of 2 or more) as illustrated in FIG. 8 on the front surface 30a thereof. The plurality of semiconductor chips 40 (see FIG. 1) can be mounted on the plurality of electrode patterns 34-1 to 34-2k through the plurality of bonding wires 41. The plurality of electrode patterns 34-1 to 34-2k are electrically connected to the external electrodes 60 through the conductive layer 14 and the through-hole electrodes 15 of the interposer 10n through the wiring in the interposer 30n.

The third modification is similar to the at least one embodiment in that the interposer 30n is formed of a material that has a higher radiation shielding ability than that of the interposer 10n and has mechanical and thermal characteristics closer to those of the semiconductor chip 20. With this configuration, radiation (for example, α-ray) coming from the radioactive substance contained in the interposer 10n can be effectively shielded over a wider area. The interposer 30n can secure a wider heat dissipation area, and thus the temperature rise of the semiconductor chip 20 can be further prevented.

Figure 9:
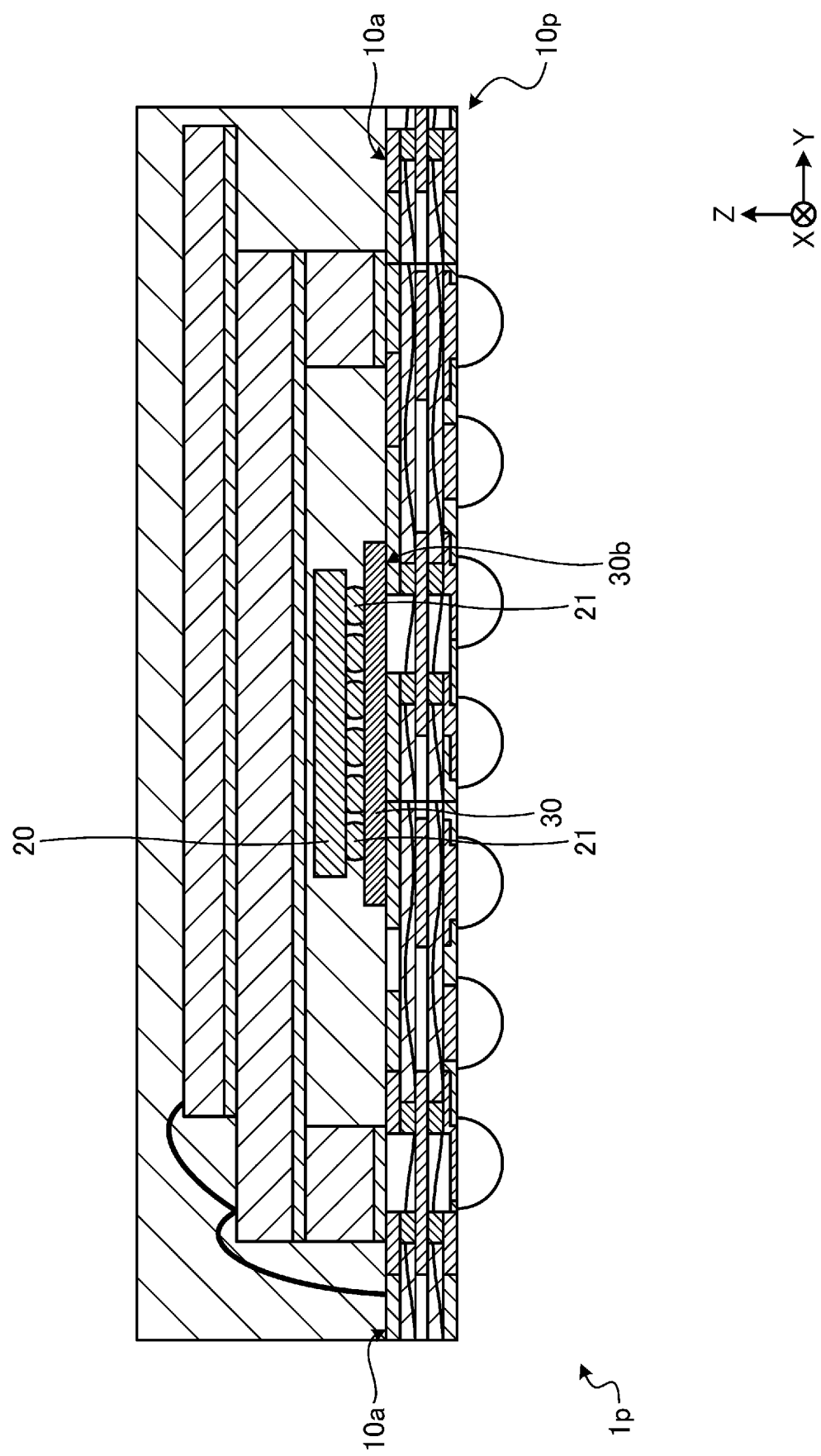
FIG. 9 is a cross-sectional view illustrating a configuration of a semiconductor device according to a fourth modification of at least one embodiment.
Figure 10:
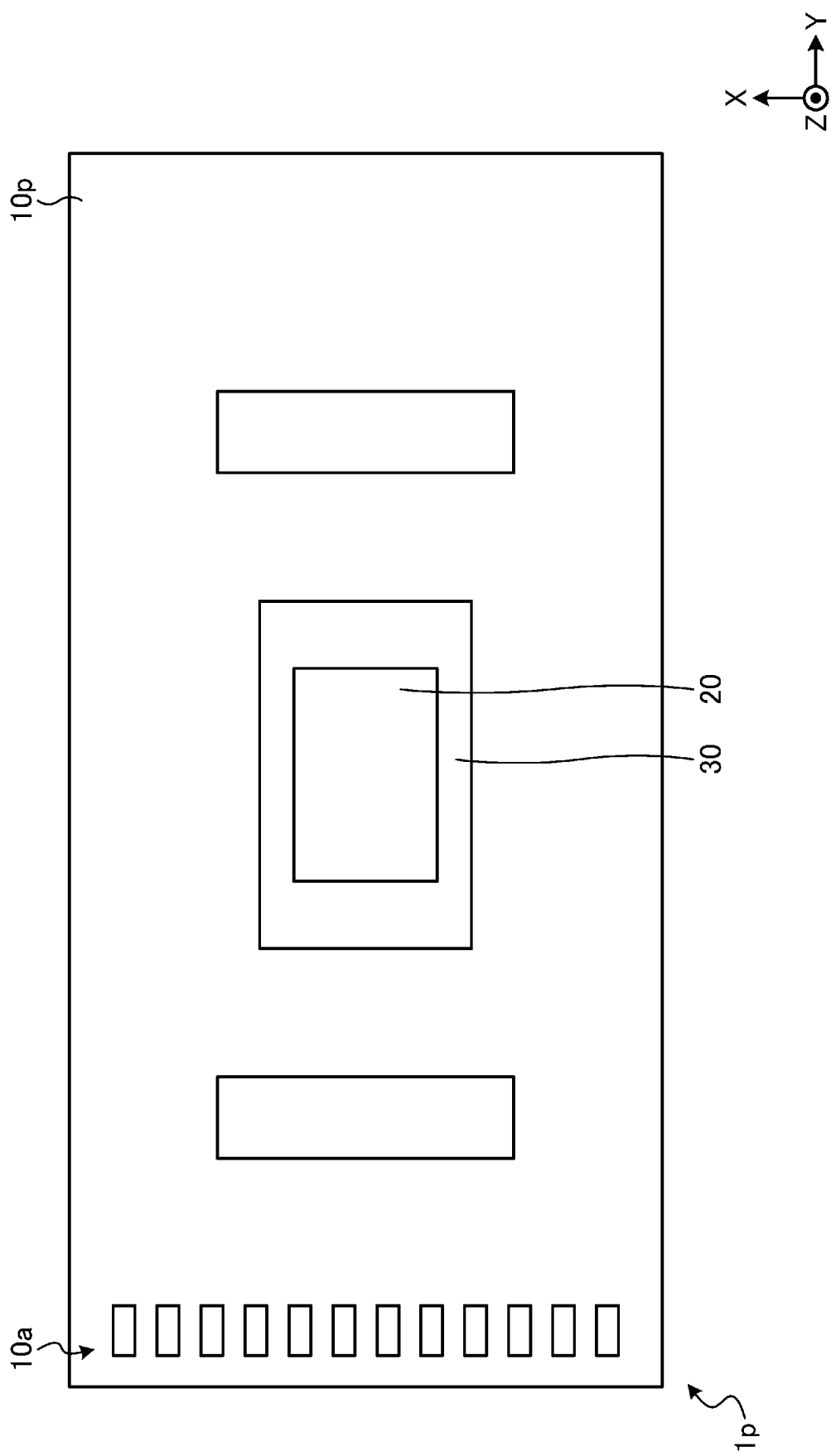
FIG. 10 is a plan view illustrating the configuration of the semiconductor device according to the fourth modification of at least one embodiment.

As a fourth modification of the at least one embodiment, as illustrated in FIGS. 9 and 10, in a semiconductor device 1p, the interposer 30 may be attached to the front surface 10a of the interposer 10p. FIG. 9 is a cross-sectional view illustrating a configuration of the semiconductor device 1p. FIG. 10 is a plan view illustrating the configuration of the semiconductor device 1p. An XY-area of the interposer 30 corresponds to an XY-area of the semiconductor chip 20, and may be an area obtained by adding an area of the arrangement margin to the XY-area of the semiconductor chip 20, for example. The opening 10a1 (see FIGS. 1 and 2) is not disposed on the front surface 10a of the interposer 10n. The interposer 30 can be attached to the front surface 10a of the interposer 10n through an adhesive (not illustrated). Alternatively, when the interposer 30 includes an electrode on the rear surface 30b, the electrode can be attached to the front surface 10a of the interposer 10n by alloying the electrode on the rear surface 30b with the electrode on the front surface 10a of the interposer 10n. With this configuration, a processing process for forming the opening 10a1 on the front surface 10a of the interposer 10p can be omitted, and thus the mounting cost of the semiconductor device 1p can be reduced.

Figure 11:
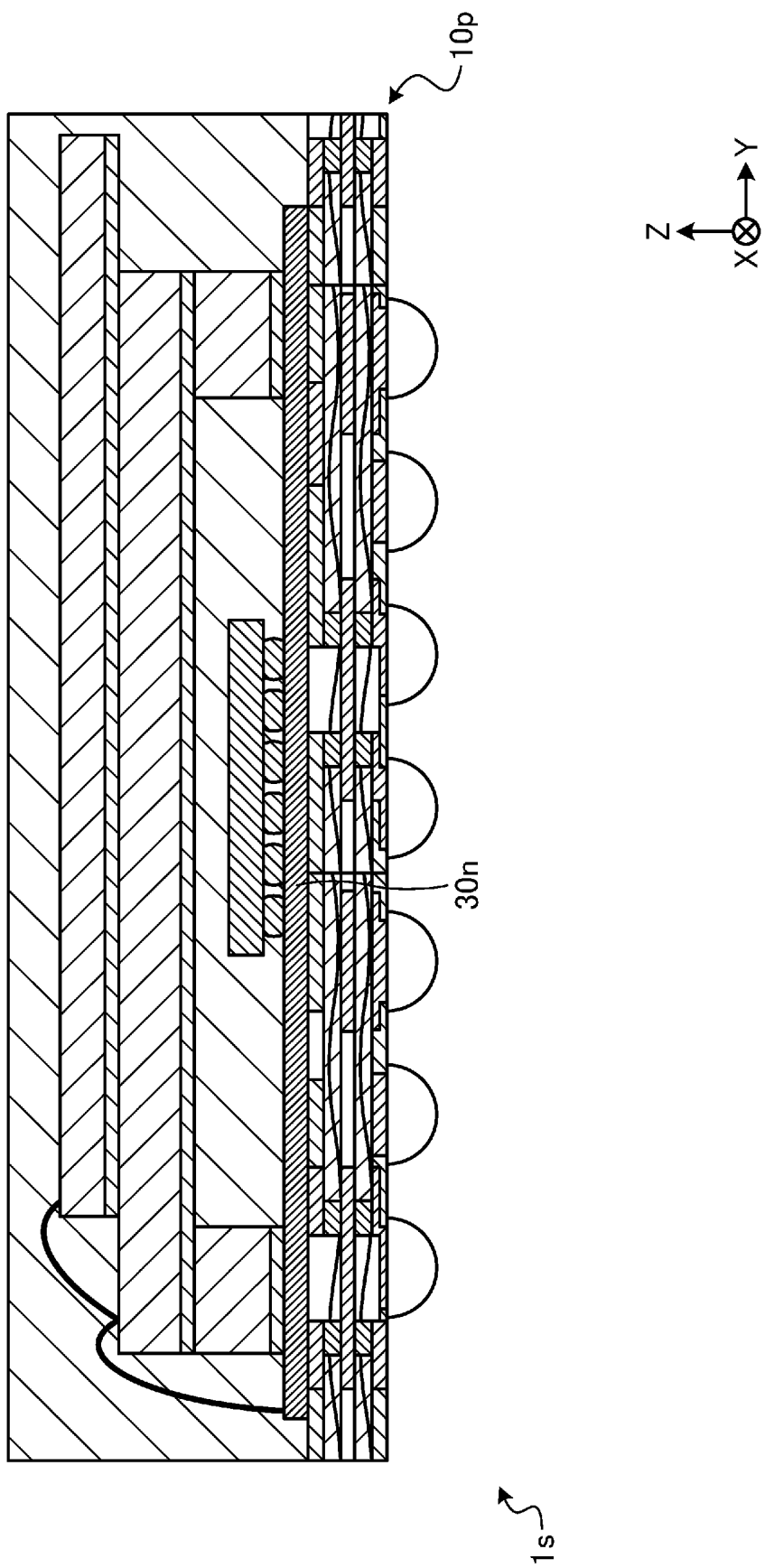
FIG. 11 is a cross-sectional view illustrating a configuration of a semiconductor device according to a fifth modification of at least one embodiment.
Figure 12:
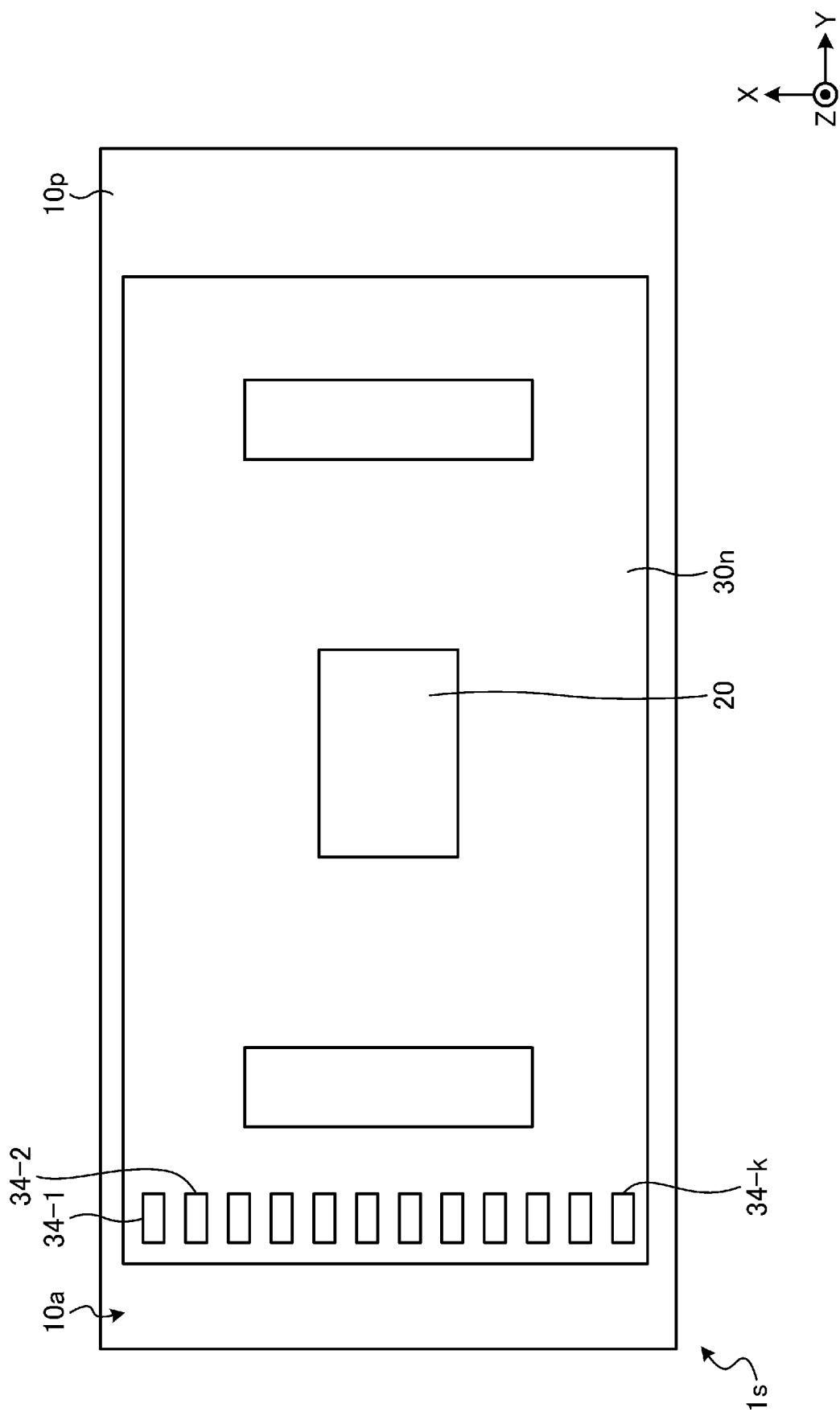
FIG. 12 is a plan view illustrating the configuration of the semiconductor device according to the fifth modification of at least one embodiment.

As a fifth modification of the at least one embodiment, as illustrated in FIGS. 11 and 12, in a semiconductor device 1s, the area of the interposer 30n corresponds to the area of the interposer 10p, and the interposer 30n may be attached to the front surface 10a of the interposer 10p. FIG. 11 is a cross-sectional view illustrating a configuration of the semiconductor device 1s. FIG. 12 is a plan view illustrating the configuration of the semiconductor device 1s. The interposer 30n may have the same shape and dimensions as those of the interposer 30n of the third modification. The interposer 10p may have the same shape and dimensions as those of the interposer 30n of the fourth modification.

The fifth modification is similar to the at least one embodiment in that the interposer 30n is made of a material that has a higher radiation shielding ability than that of the interposer 10p and has mechanical and thermal characteristics closer to those of the semiconductor chip 20. With this configuration, radiation (for example, α-ray) coming from the radioactive substance contained in the interposer 10p can be effectively shielded over a wider area. The interposer 30n can secure a wider heat dissipation area, and thus the temperature rise of the semiconductor chip 20 can be further prevented. The processing process for forming the opening 10a1 (see FIGS. 1 and 2) on the front surface 10a of the interposer 10p can be omitted, and thus the mounting cost of the semiconductor device is can be reduced.

Figure 13:
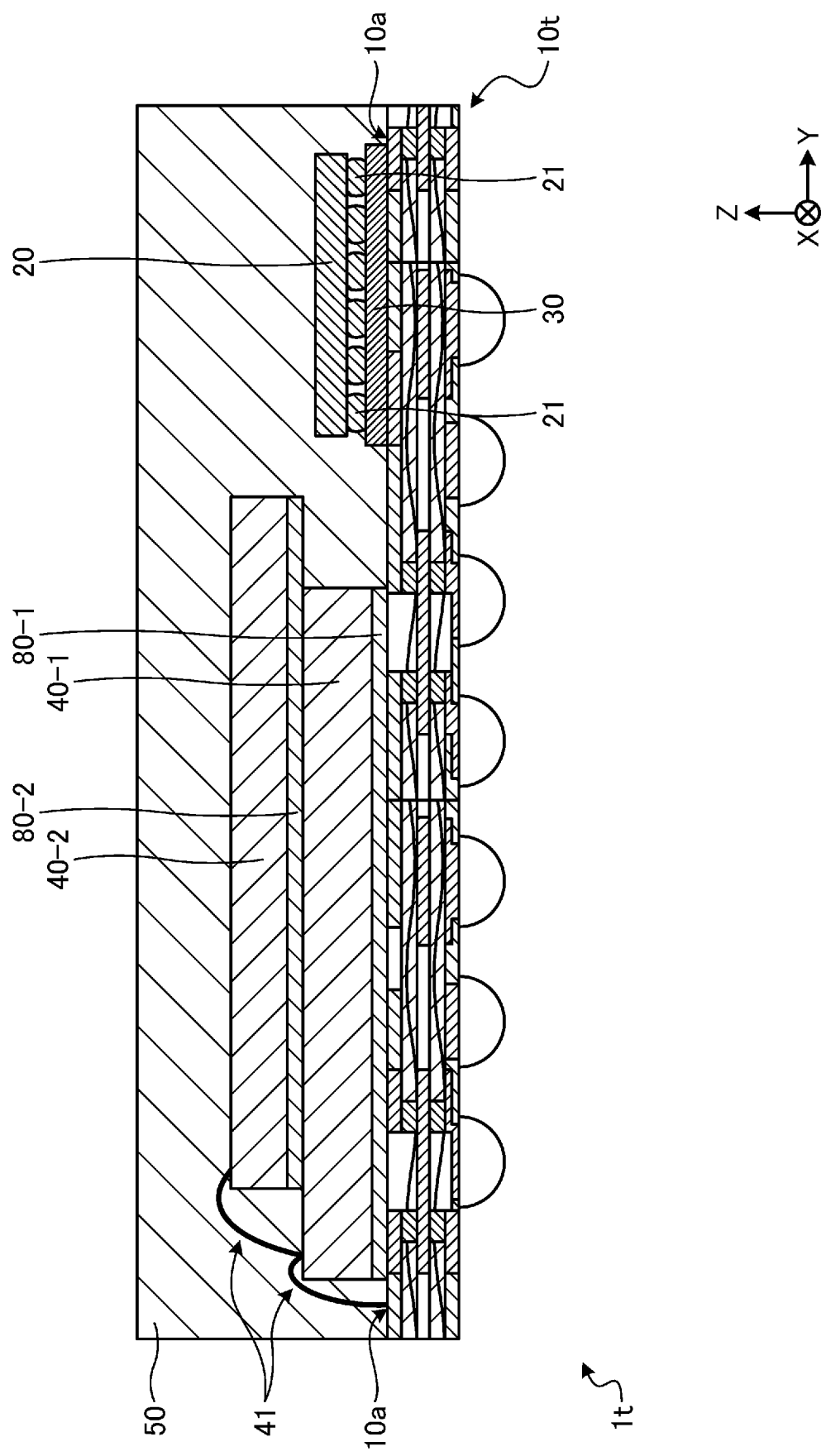
FIG. 13 is a cross-sectional view illustrating a configuration of a semiconductor device according to a sixth modification of at least one embodiment.
Figure 14:
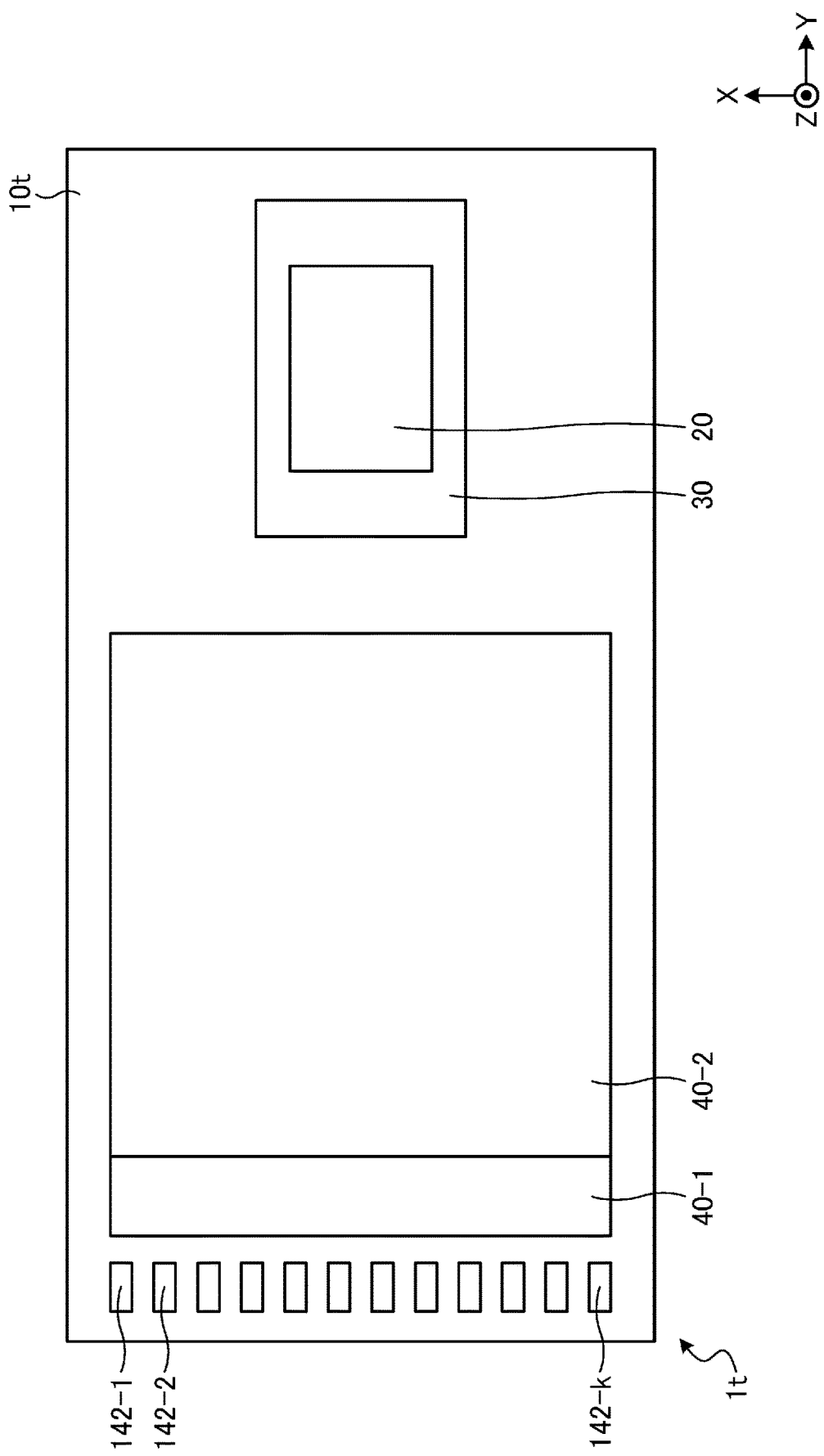
FIG. 14 is a plan view illustrating the configuration of the semiconductor device according to the sixth modification of at least one embodiment.

As a sixth modification of the embodiment, as illustrated in FIGS. 13 and 14, a semiconductor device 1t may be mounted in a side-by-side structure. FIG. 13 is a cross-sectional view illustrating a configuration of the semiconductor device 1t. FIG. 14 is a plan view illustrating the configuration of the semiconductor device 1t.

The plurality of semiconductor chips 40-1 and 40-2 are stacked on the +Z-side from the front surface 10a of the interposer 10t at positions separated from the semiconductor chip 20 in the XY-direction. The plurality of semiconductor chips 40-1 and 40-2 can be mounted on the interposer 10t by the wire bonding method. In this case, the conductive layer 14 to which the plurality of bonding wires 41 in the interposer 10t can be electrically connected includes a plurality of electrode patterns 142-1 to 142-2k (k is any integer of 2 or more) on the front surface 10a (main surface on the +Z-side) (see FIG. 2). With this configuration, the plurality of semiconductor chips 40-1 and 40-2 can be mounted on the interposer 10t in the side-by-side structure by the wire bonding method.

In this case, in the semiconductor device 1t, the interposer 30 is interposed between the interposer 10t and the semiconductor chip 20. The interposer 30 maybe attached to the front surface 10a of the interposer 10t. For example, the interposer 30 overlaps the semiconductor chip 20 in the Z-direction. The sixth modification is similar to the embodiment in that the interposer 30 is made of a material that has a higher radiation shielding ability than that of the interposer 10t and has mechanical and thermal characteristics closer to those of the semiconductor chip 20. With this configuration, radiation (for example, α-ray) coming from the radioactive substance contained in the interposer 10t can be effectively shielded by the interposer 30. When the semiconductor device 1t is placed in a high temperature environment or the like, stress acting between the interposer 30 and the semiconductor chip 20 through the bump electrode 21 can be reduced. The interposer 30 can function as a heat slug that releases the heat of the semiconductor chip 20 in a direction of XY-plane and dissipates heat to the surrounding atmosphere.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first interposer having a first main surface;
a second interposer disposed on the first main surface, the second interposer having a second main surface on a side opposite to the first interposer, and formed of a material different from the first interposer;
a first semiconductor chip having a first front surface facing the second main surface, the first semiconductor chip mounted on the second main surface using a plurality of bump electrodes, the first semiconductor chip further including a volatile memory circuit; and
a second semiconductor chip mounted on a plurality of electrode patterns disposed on the first main surface or the second main surface through a plurality of bonding wires,
wherein the second interposer overlaps the first semiconductor chip in a direction perpendicular to the first main surface,
wherein the first interposer has an opening in the first main surface, and the second interposer is disposed within the opening.

2. The semiconductor device according to claim 1, wherein the first interposer contains radioactive material, and the second interposer has a higher radiation shielding ability than that of the first interposer.

3. The semiconductor device according to claim 1, wherein a difference between a coefficient of linear expansion of the second interposer and a coefficient of linear expansion of the first semiconductor chip is smaller than a difference between a coefficient of linear expansion of the first interposer and the coefficient of linear expansion of the first semiconductor chip.

4. The semiconductor device according to claim 1, wherein a thermal conductivity of the second interposer is higher than that of the first interposer.

5. The semiconductor device according to claim 1, wherein the first interposer is an organic interposer and the second interposer is a semiconductor interposer.

6. The semiconductor device according to claim 1, wherein an area of the second interposer corresponds to an area of the first semiconductor chip.

7. The semiconductor device according to claim 1, wherein the second interposer is thinner than the first interposer.

8. The semiconductor device according to claim 7, wherein a thickness of the second interposer is 58 µm or more.

9. The semiconductor device according to claim 7, wherein a thickness of the second interposer is 32 µm or more.

10. The semiconductor device according to claim 1, wherein the opening has a planar shape.

11. The semiconductor device according to claim 1, wherein the volatile memory circuit includes a memory controller.

12. The semiconductor device according to claim 1, wherein the second semiconductor chip includes a memory chip.

13. The semiconductor device according to claim 1, wherein the first semiconductor chip has a flip chip structure.

14. The semiconductor device according to claim 1, wherein the second semiconductor chip is one of a plurality of second semiconductor chips stacked in a stepwise fashion.

15. The semiconductor device according to claim 14, wherein the first semiconductor chip is disposed directly below a lowest stage of the plurality of second semiconductor chips.

16. The semiconductor device according to claim 1, wherein the second semiconductor chip has a larger chip size than that of the first semiconductor chip.

17. A semiconductor device comprising:
a first interposer having a first main surface;
a second interposer disposed on the first main surface, the second interposer having a second main surface on a side opposite to the first interposer, and formed of a material different from the first interposer;

a first semiconductor chip having a first front surface facing the second main surface, the first semiconductor chip mounted on the second main surface using a plurality of bump electrodes, the first semiconductor chip further including a volatile memory circuit; and a second semiconductor chip mounted on a plurality of electrode patterns disposed on the first main surface or the second main surface through a plurality of bonding wires, wherein the second interposer overlaps the first semiconductor chip in a direction perpendicular to the first main surface, wherein the second main surface is flush with a top surface of the first interposer.

* * * * *